United States Patent [19]

Ishihara et al.

[11] Patent Number: 4,778,692
[45] Date of Patent: * Oct. 18, 1988

[54] PROCESS FOR FORMING DEPOSITED FILM

[75] Inventors: Shunichi Ishihara, Ebina; Shigeru Ohno, Yokohama; Masahiro Kanai; Shunri Oda, both of Tokyo; Isamu Shimizu, Yokohama, all of Japan

[73] Assignee: Canon Kabushiki Kaisha, Tokyo, Japan

[*] Notice: The portion of the term of this patent subsequent to Feb. 23, 2005 has been disclaimed.

[21] Appl. No.: 831,460

[22] Filed: Feb. 20, 1986

[30] Foreign Application Priority Data

Feb. 20, 1985 [JP]  Japan .................................. 60-032209
Feb. 22, 1985 [JP]  Japan .................................. 60-034773

[51] Int. Cl.⁴ .............................................. B05D 3/06
[52] U.S. Cl. .................................... 427/53.1; 430/57; 430/130; 430/134; 437/241
[58] Field of Search ................ 427/86, 53.1; 430/57, 430/130, 134; 437/241

[56] References Cited

U.S. PATENT DOCUMENTS

| | | |
|---|---|---|
| 4,084,024 | 4/1978 | Schumacher . |
| 4,217,374 | 8/1980 | Ovshinsky ............................ 427/39 |
| 4,410,559 | 10/1983 | Hamakawa et al. . |
| 4,419,381 | 12/1983 | Yamazaki . |
| 4,439,463 | 3/1984 | Miller . |
| 4,448,801 | 5/1984 | Fukuda . |
| 4,450,185 | 5/1984 | Shimizu et al. . |
| 4,466,992 | 8/1984 | Dreiling . |
| 4,468,413 | 8/1984 | Bachman . |
| 4,468,443 | 8/1984 | Shimizu ................................ 430/60 |
| 4,471,042 | 9/1984 | Komatsu ............................... 430/64 |
| 4,514,437 | 4/1985 | Nath . |
| 4,517,223 | 5/1985 | Ovshinsky ............................ 427/39 |
| 4,532,199 | 7/1985 | Ueno . |
| 4,546,008 | 10/1985 | Saitoh . |
| 4,554,180 | 11/1985 | Hirooka . |
| 4,564,533 | 1/1986 | Yamazaki . |
| 4,567,127 | 1/1986 | Saitoh ................................... 430/65 |
| 4,569,697 | 2/1986 | Tsu et al. . |

*Primary Examiner*—Shrive Beck
*Assistant Examiner*—Vi Duong Dang
*Attorney, Agent, or Firm*—Fitzpatrick, Cella, Harper & Scinto

[57] ABSTRACT

A process for forming a deposited film, which comprises introducing into a film forming space for formation of a deposited film on a substrate an active species (A) formed by decomposition of a compound containing silicon and a halogen and an active species (B) formed from a germanium containing compound for film formation which is chemically mutually reactive with said active species (A) separately from each other, and then permitting the above respective active species and said germanium containing compounds to react chemically with each other by excitation by irradiation of light energy thereby to form a deposited film on the above substrate.

21 Claims, 5 Drawing Sheets

PROCESS FOR FORMING DEPOSITED FILM

BACKGROUND OF THE INVENTION

1. Field of the invention

This invention relates to a process for forming a deposited film containing germanium, above all a functional film, particularly an amorphous or crystalline deposited film containing germanium to be used for semiconductor device, photosensitive device for electrophotography, line sensor for image input, image pick-up device, photovoltaic device, etc.

2. Description of the Prior Art

For example, for formation of an amorphous silicon film, the vacuum deposition method, the plasma CVD method, the CVD method, the reactive sputtering method, the ion plating method, the optical CVD method have been attempted to be practiced, and, in general, the plasma CVD method has widely been used and industrialized.

However, for the deposited film constituted of amorphous silicon, there is room left for further improvement of overall characteristics with respect to electrical, optical characteristics and, fatigue characteristic or use environmental characteristic in repeated uses, further productivity and mass productivity including uniformity and reproducibility.

The reaction process in formation of amorphous silicon deposited film according to the plasma CVD method generalized in the prior art is considerably complicated as compared with the CVD method of the prior art, and not a few ambiguities existed in its reaction mechanism. Also, there are involved a large number of parameters for formation of its deposited film (e.g. substrate temperature, flow rates and their ratios of gases introduced, pressure during film formation, high frequency power, electrode structure, structure of reaction vessel, gas discharging speed, plasma generation system, etc.), and the plasma formed by combination of such a large number of parameters may sometimes become unstable to frequently give markedly bad influences to the deposited film formed. Besides, the parameters inherent in the device must be chosen for each device, and it has been difficult under the present situation to generalize the production conditions. On the other hand, for exhibiting electrical, optical or mechanical characteristics of an amorphous silicon film satisfactorily for respective uses, it has been deemed best to form an amorphous silicon film according to the plasma CVD method under the present situation.

However, depending on the applied uses of the deposited film, since it is required to satisfy sufficiently enlargement of area, uniformization of film thickness, uniformity of film quality, and also to attempt to perform a mass production with reproducibility by a high speed film formation, enormous equipment capital becomes necessary for mass production devices in formation of amorphous silicon deposited films according to the plasma CVD method, and the management items for mass prodution thereof will become complicated to make the management tolerance narrower. These matters, and also subtlety in adjustment of the devices, have been pointed out as the problems to be improved in the future. On the other hand, in the conventional CVD methods of the prior art, high temperture is required to be used and no deposited film having practical characteristics could be obtained.

As described above, in formation of amorphous silicon films, it has earnestly been desired to develop a formation process which can perform mass production by means of a low cost device while maintaining practical characteristics and uniformity. These discussions may also be applicable to other functional films such as silicon nitride films, silicon carbide films, silicon oxide films, etc.

SUMMARY OF THE INVENTION

The present invention provides a novel process for formation of a deposited film which removes the drawbacks of the plasma CVD method as described above and also uses no formation method of the prior art.

An object of the present invention is to provide a process for forming a deposited film which is suitable for enlargement of the film and can easily accomplish improvement of productivity and mass production of the film, while attmpting to improve various characteristics of the film formed, the film forming speed and reproducibility and also to uniformize film quality.

The above object can be accomplished by a process for forming a deposited film of the invention, which comprises introducing into a film forming space for formation of a deposited film on a substrate an activated species (A) formed by decomposition of a compound containing silicon and a halogen and an active species (B) formed from a germanium containing compound for film formation which is chemically mutually reactive with said active species (A) separately from each other, and then permitting the above respective active species and respective compounds to react chemically with each other by excitation by irradiation of light energy thereby to form a deposited film on the above substrate.

Alternatively, the above object can be accomplished by introducing the above active species (A) and (B) into the film forming space for formation of a deposited film on a substrate separately from each other, and then permitting these to react chemically with each other by action of heat energy thereby to form a deposited film on the above substrate.

According to one aspect of the present invention, there is provided a process for forming a deposited film, which comprises introducing into a film forming space for formation of a deposited film on a substrate an active species (A) formed by decomposition of a compound containing silicon and a halogen and an active species (B) formed from a germanium containing compound for film formation which is chemically mutually reactive with said active species (A) separately from each other, and then permitting the above respective active species and said germanium containing compound to react chemically with each other by excitation by irradiation of light energy thereby to form a deposited film on the above substrate.

According to another aspect of the present invention, there is provided a process for forming a deposited film, which comprises introducing into a film forming space for formation of a deposited film on a substrate an active species (A) formed by decomposition of a compound containing silicon and a halogen and an active species (B) formed from a germanium containing compound for film formation which is chemically mutually reactive with said active species (A) separately from each other, and then permitting these to react chemically with each other by the action of heat energy thereby to form a deposited film on the above susbstrate.

DESCRIPTION OF THE PREFERRED EMBODIMENTS

Figure 1:
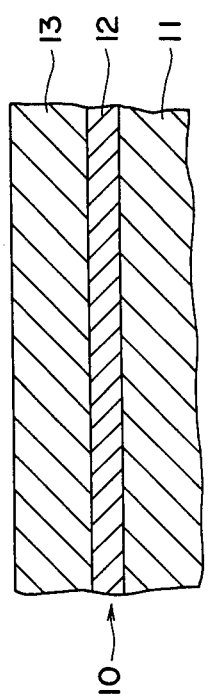
FIG. 1 is a schematic sectional view for illustration of a construction example of the image forming member for electrophotography produced by use of the process of the present invention.

In the process of the present invention, in place of exciting plasma in the film forming space for formation of a deposited film, in the co-presence of the active species (A) formed by decomposition of a compound containing silicon and a halogen and the active species (B) formed from a germanium containing compound for film formation, light energy and/or heat energy is permitted to act thereon, thereby causing, promoting or amplifying the chemical mutual reaction therebetween. Accordingly, the deposited film formed is free from bad influence by etching action or other actions such as abnormal discharging action.

Further, while the excitation energy is imparted uniformly, or selectively and controllably to the starting materials which have reached near the substrate, by use of light energy, the light energy can be irradiated on the whole substrate by use of a suitable optical system to form a deposited film thereon, or alternatively selectively and controllably only on a desired portion to form a partially deposited film. Also, by use of a resist, etc., only the desired pattern portion can be used to form a deposited film. For these conveniences, light energy can be advantageously used.

Also, according to the present invention, by controlling the atmospheric temperature in the film forming space, the substrate temperature as desired, the CVD method can be made more stable.

The heat energy for exciting and reacting the starting materials for formation of a deposited film in the present invention is permitted to act on at least a portion in the vicinity of the substrate or wholly in the film forming space. The heating source to be employed is not particularly limited, but heating medium known in the art, for example, heating by a heating body such as resistance heating, high frequency heating, etc. can be employed. Alternatively, heat energy converted from light energy may also be available. Also, if desired, light energy may be used in addition to heat energy in combination. Since light energy can be irradiated on the whole substrate or selectively and controllably only on a desired portion by use of a suitable optical system, the position where the deposited film is to be formed on the subtrate or its film thickness can be easily controlled.

One of the points of the process of the present invention different from the CVD process of the prior art is used of active species which are previously activated in a space different from the film forming space (hereinafter referred to as activation space). By doing so, the film forming speed can be dramatically increased. In addition, the substrate temperature can be lowered to a great extent, whereby deposited films having stable film quality can be provided commercially in a large amount and yet at low cost.

The above active species (A) as herein mentioned refers to those having the action of promoting formation of deposited films by causing chemical mutual actions with a germanium contining compound which is the starting material for formation of the above deposited film or excited active species (B) formed therefrom, thereby imparting energy or causing chemical reactions to occur.

In the present invention, the active species (A) introduced from the activation space (A) may be preferably selected and used as desired from those having the life of 0.001 sec., more preferably 0.01 sec. or longer, optimally 0.1 sec. or longer, from the standpoint of productivity and easiness in handling.

The germanium compound for film formation is activated by activation energy in the activation space (B) to form active species (B), and said active species (B) is introduced into the film forming space to be excited and reacts mutually with active species (A) which is introduced at the same time from the activation space (A) in formation of a deposited film through the action of light energy and/or heat energy. As a result, a desired deposited film is easily formed on a desired substrate.

The active species (B) formed from a germanium containing compound has its constituent elements which constitute the components constituting the deposited film to be formed in the film forming space.

The germanium containing compound used in the present invention to be introduced into the activation space (B) should preferably be already gaseous before introduction into the activation space (B), or introduced into the activation space (B) after gasification. For example, when employing a liquid compound, the compound can be gasified by means of a gasifying device connected to the source for supplying the compound before introduction into the activation space (B).

As the above germanium containing compound, there may be employed germanium containing inorganic or organic compounds having hydrogen, halogen or hydrocarbon groups bonded to germanium, as exemplified by organic germanium compounds such as chain or cyclic hydrogenated germanium represented by $Ge_aH_b$ (a is an integer of 1 or more, $b=2a+2$ or $2a$), polymers of the hydrogenated germanium, compounds in which a part or all of the hydrogen atoms in the above hydrogenated germanium are substituted by halogen atoms, compounds in which a part or all of the hydrogen atoms in the above hydrogenated germanium compound are substituted by organic groups such as alkyl groups, aryl groups, etc. and halogen atoms, if desired, and other germanium compounds.

Specifically, there may be included, for example, $GeH_4$, $Ge_2H_6$, $Ge_3H_8$, n-$Ge_4H_{10}$, tert-$Ge_4H_{10}$, $Ge_3H_6$, $Ge_5H_{10}$, $GeH_3F$, $GeH_3Cl$, $GeH_2F_2$, $H_6GeF_6$, $Ge(CH_3)_4$, $Ge(C_2H_5)_4$, $Ge(C_6H_5)_4$, $Ge(CH_3)_2F_2$, $CH_3GeH_3$, $(CH_3)_2GeH_2$, $(CH_3)_2GeH$, $(C_2H_5)_2GeH_2$, $GeF_2$, $GeF_4$, $GeS$, etc. These germanium compounds may be used either alone or as a combination of two or more compounds.

In the present invention, as the compound containing silicon and halogen to be introduced into the activation space (A), there may be employed, for example, chain or cyclic hydrogenated silicon of which hydrogen atoms are partially or wholly substituted by halogen atoms, typically chain silicon halides represented by $Si_uY_{2u+2}$ (u is an integer of 1 or more, Y is at least one element selected from F, Cl, Br and I) and cyclic silicon halides $Si_vY_{2v}$ (v is an integer of 3 or more, and Y has the same meaning as defined above), chain and cyclic compounds represented by $Si_uH_xY_y$ (u and Y have the same meanings as defined above, $x+y=2u$ or $2u+2$).

Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $SiBr_6$, $SiHCl_3$, $SiHBr_3$, $SiHI_3$, $Si_2Cl_3F_3$, and the like.

For formation of the active species (A), in addition to the above compound containing silicon and halogen, other silicon containing compounds such as single substance of silicon, etc., hydrogen, a halogen containing compound (e.g. $F_2$ gas, $Cl_2$ gas, gasified $Br_2$, $I_2$, etc.) may be used in combination.

In the present invention, as the method for forming active species (A) and (B) in the activation spaces (A) and (B), respectively, there may be employed various activation energies such as electrical energies, including microwave, RF, low frequency, DC, etc., heat energies such as heater heating, IR-ray heating, etc., photoenergy, etc. in view of respective conditions and the divice.

By application of activated energy such as heat, light and discharging to the compounds as described in above in an activation space, the activated species can be formed.

In the present invention, the proportion in amount of the above active species (A) to the active species (B) formed from a germanium containing compound in the film forming space may suitably be determined depending on the film forming conditions, the kind of the active species, etc., but may preferably be 10:1 to 1:10 (inflow rate ratio), more preferably 8:2 to 4:6.

In the present invention, as the starting materials other than germinium containing compounds for film formation, it is possible to introduce hydrogen gas, a halogen compound (e.g. $F_2$ gas, $Cl_2$ gas, gasified $Br_2$, $I_2$, etc.), an inert gas such as argon, neon, etc. or a silicon containing compound, carbon containing compound as the starting material for formation of deposited film into the film forming space. When a plurality of these starting gases are to be employed, they can previously mixed before introduction into the film forming space for film formation, or alternatively these starting gases can individually be supplied from feeding sources independent of each other to be introduced into the film forming space.

As the silicon containing compound to be introduced into the activation space (B), there may be employed most of the compounds which can be activated by the action of an activation energy such as light, heat, electricity, etc. to form efficiently active species (B). Among them, there may be employed effectively the so-called silicon compounds, for example, the compounds silicon as the cationic component. Such silicon containing compounds may include silanes, siloxanes, etc. having hydrogen, halogen and hydrocarbon groups bonded to silicon. Above all, chain and cyclic silane compounds, or these chain and cyclic silane compounds of which hydrogen atoms are substituted partially or wholly by halogen atoms are preferred.

Specifically, there may be included, for example, straight chain silane compounds represented by $Si_pH_{2p+2}$ (p is 1 or more, preferably 1 to 15, more preferably 1 to 10) such as $SiH_4$, $Si_2H_6$, $Si_3H_8$, $Si_4H_{10}$, $Si_5H_{12}$, $Si_6H_{14}$, etc.; branched chain silane compounds represented by $Si_pH_{2p+2}$ (p has the same meaning as mentioned above) such as $SiH_3SiH(SiH_3)SiH_3$, $SiH_3SiH(SiH_3)Si_3H_7$, $Si_2H_5SiH(SiH_3)Si_2H_5$, etc.; these straight chain or branched chain compounds in which a part or all of the hydrogen atoms are substituted by halogen atoms; cyclic silane compounds represented by $Si_qH_{2q}$ (q is an integer of 3 or more, preferably 3 to 6) such as $Si_3H_6$, $Si_4H_8$, $Si_5H_{10}$, $Si_6H_{12}$, etc.; said cyclic silane compounds in which a part or all of the hydrogen atoms are substituted by other cyclic silanyl groups and/or chain silanyl groups. Examples of the above silane compounds in which a part or all of the hydrogen atoms are substituted by halogen atoms may include halo-substituted chain or cyclic silane compounds represented by $Si_rH_sX_t$ (X is a halogen atom, r is an integer of 1 or more, preferably 1 to 10, more preferably 3 to 7, $s+t=2r+2$ or $2r$) such as $SiH_3$; F, $SiH_3Cl$, $SiH_3Br$, $SiH_3I$, etc. These compounds may be used either alone or as a combination of two or more compounds.

As the carbon containing compound to be introduced into the activation space (B), there may be employed preferably gaseous or readily gasifiable compounds selected from among chain or cyclic saturated or unsaturated hydrocarbon compounds, organic compounds containing carbon and hydrogen as the main constituent atoms and otherwise at least one of silicon, halogen, sulphur as constituent atoms, and organic silicon compounds containing hydrocarbon groups as constituent components. Among them, as hydrocarbon compounds, there may be included saturated carbon atoms having 1 to 5 carbon atoms, ethylenic hydrocarbons having 2 to 5 carbon atoms, acetylenic hydrocarbons having 2 to 4 carbon atoms, including specifically, as saturated hydrocarbons methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2($C_4H_8$), isobutylene ($C_4H_8$), pentene ($C_5H_{10}$); as acetylenic hydrocarbons, acetylene ($C_2H_2$), methylacetylene ($C_3H_4$), butyne ($C_4H_6$), etc.

Organic silicon compounds may include $(CH_3)_4Si$, organochlorosilanes such as $CH_3SiCl_3$, $(CH_3)_2SiCl_2$, $(CH_3)_3SiCl$, $C_2H_5SiCl_3$, etc., organochlorofluorosilanes such as $CH_3SiF_2Cl$, $CH_3SiFCl_2$, $(CH_3)_2SiFCl$, $C_2H_5SiF_2Cl$, $C_2H_5SiFCl_2$, $C_3H_7SiF_2Cl$, $C_3H_7SiFCl_2$, etc. organodisilazanes such as $[(CH_3)_3Si]_2$, $[C_3H_7)_3Si]_2$.

These carbon containing compounds may be used either alone or as a combination of two or more compounds.

Also, the deposited film formed according to the present invention can be doped with an impurity element during or after film formation. As the impurity element to be used, there may be employed, as p-type impurity, as element belonging to the group IIIA of the periodic table such as B, Al, Ga, In, Tl, etc. and, as n-type impurity, an element belonging to the group VA of the periodic table such as P, As, Sb, Bi, etc as suitable ones. Particularly, B, Ga, P and Sb are most preferred. The amount of the impurity for doping may be determined suitably depending on the desired electrical and optical characteristics.

As the substance containing such as impurity atom as the component (substance for introduction of impurity), it is preferable to select a compound which is gaseous under normal temperature and normal pressure, or gaseous at least under the conditions for formation of deposited film and can be readily gasified by a suitable gasifying device. Such compounds may include $PH_3$, $P_2H_4$, PF$_3$, PF$_5$, PCl$_3$, AsH$_3$, AsF$_3$, AsF$_5$, AsCl$_3$, SbH$_3$, SbF$_5$, SbCl$_3$, BF$_3$, BCl$_3$, BBr$_3$, B$_2$H$_6$, B$_4$H$_{10}$, B$_5$H$_9$, B$_5$H$_{11}$, B$_6$H$_{10}$, B$_6$H$_{12}$, AlCl$_3$, etc. The compounds containing an impurity element may be used either singly or as a combination of two or more compounds.

The substance for introduction of impurity may be introduced into the activation space (A) and/or the activation space (B) together with the respective substances for formation of the active species (A) and the active species (B) to be activated therein, or alternatively activated in a third activation space (C) separate from the activation space (A) and the activation space (B). The energy for activating the substance for introduction of impurity can be suitably selected from the abovementioned activation energies for the active species (A) and the species (B). The active species(PN) formed by activation of the substance for introduction of impurity may be previously mixed with the active species (A) and/or the active species (B) before introduction into the film forming space or independently introduced into the film forming space.

For introducing a compound containing an impurity element as the component into the activation space (B), it can be previously mixed with the germanium containing compound for film formation, etc. as described above, or these starting gases can be individually introduced from a plurality of independent gas feeding sources.

Next, the present invention is described by referring to a typical example of the image forming member for electrophotography formed by the process of the present invention.

FIG. 1 is a schematic sectional view for illustration of the construction example of a typical photoconductive member obtained by the present invention.

The photoconductive member 10 shown in FIG. 1 is applicable as an image forming member for electrophotography, and has a layer construction comprising an intermediate layer 12 which may optionally be provided and a photosensitive layer 13 provided on a substrate 11 for photoconductive member.

In the preparation of the photoconductive member 10, the intermediate layer 12 and/or the photosensitive member 13 can be prepared according to the process of the present invention. Further, when the photoconductive member 10 has as protective layer provided for the purpose of protecting chemically or physically the surface of the photosensitive layer 13, or a lower barrier layer and/or an upper barrier layer provided for improving dielectric strength, these layers can also be prepared according to the process of the present invention.

The substrate 11 may be either electroconductive or insulating. As the electroconductive substrate, there may be mentioned metals such as NiCr, stainless steel, Al, Cr, Mo, Au, Ir, Nb, Ta, V, Ti, Pt, Pd, etc. or alloys thereof.

As insulating substrates, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to treatment for imparting electroconductivity, and it is desirable to provide other layer on the side at which said electroconductive treatment has been applied.

For example, electroconductive treatment of a glass can be effected by providing a thin film of NiCr, Al, Cr, Mb, Au, Ir, Nb, Ta, V, Ti, Pt, Pd, In$_2$O$_3$, SnO$_2$, ITO (In$_2$O$_3$+SnO$_2$), etc. thereon. Alternatively, a synthetic resin film such as polyester film can be subjected to the electroconductive treatment on its surface by vacuum vapor deposition, electron-beam deposition, sputtering or the like of a metal such as NiCr, Al, Ag, Pb, Zn, Ni, Au, Cr, Mo, Ir, Nb, T, V, Ti, Pt, etc. or by laminating treatment with said metal, thereby imparting electroconductivity to the surface. The substrate may be shaped in any form such as cylinders, belts, plates or others, and its form may be determined as desired. For example, when the photoconductive member 10 in FIG. 1 is to be used as the light-receiving member for electrophotography, it may desirably be formed into an endless belt or a cylinder for use in continuous high speed copying.

For example, the intermediate layer 12 has the function of impeding effectively inflow of the carriers from the side of the substrate 11 into the photosensitive layer 13 and readily permitting passage of the photocarriers, formed by irradiation of electromagnetic wave in the photosensitive layer 13 and migrating toward the side of the substrate 11, from the side of the photosensitive layer 13 to the side of the substrate 11.

The intermediate layer 12 is constituted of an amorphous germanium containing germanium as the matrix and optionally silicon (Si), hydrogen (H), a halogen (X), etc. as constituent atoms (hereinafter written as "A-Ge(Si, H, X)") or an amorphous material constituted of silicon atoms and germanium atoms as the matrix containing optionally hydrogen (H) and/or halogen (X) (hereinafter writeen as "A-SiGe(H, X)") and at the same time contains, for example, a p-type impurity such as B or a n-type impurity such as P as the substance for controlling electroconductivity.

In the present invention, the content of the substance for controlling conductivity such as B, P, etc. contained in the intermediate layer 12 may preferably be 0.001 to $5\times10^4$ atomic ppm, more preferably 0.5 to $1\times10^4$ atomic ppm, optimally 1 to $5\times10^3$ atomic ppm.

In the case of forming an intermediate layer 12 which is similar to or the same in constituents as the photosensitive layer 13, up to formation of the photoconductive layer 13 can continuously be performed subsequent to formation of the intermediate layer 12. In that case, as the starting material for formation of the intermediate layer, the active species (A) formed in the activation space (A), the gaseous germanium containing compound, optionally together with active species (B) formed from hydrogen, halogen compounds, inert gases, carbon containing compounds and gases of compound containing an imuprity element as the component, etc., may be introduced respectively separately into the film forming space, in which the substrate 11 is placed, and the intermediate layer 12 may be formed on the above substrate 11 by permitting light energy and/or heat energy to act in the atmosphere where the respective active species introduced are co-present.

The compound containing silicon and halogen capable of forming active species (A) by introduction into the activation space (A) during formation of the intermediate layer 12 should desirably be one selected from among the compounds as mentioned above which can form readily active species (A) such as, for example, SiF$_2$* under the action of the activation energy as described above.

The intermediate layer 12 has a layer thickness preferably of 30 Å to 10μ, more preferably 40 Å to 8μ, optimally 50 Å to 5μ.

The photosensitive layer 13 is constituted of, for example, an amorphous silicon A-Si(H, X, Ge) containing silicon atoms as the matrix and optionally hydrogen, halogen, germanium, etc. as constituent atoms or an amorphous silicon germanium A-SiGe(H, X) containing optionally hydrogen and halogen as constituent atoms and has both functions of the charge generation function of generating photocarriers by irradiation of laser beam and the function of transporting said photo charges.

The photosensitive layer 13 has a layer thickness preferably of 1 to 100μ, more preferably 1 to 80μ, optimally 2 to 50μ.

The photosensitive layer 13 is made of a non-doped A-Si(H, X, Ge) or A-SiGe(H, X) layer, but it may also contain a substance for controlling conductivity characteristic with a polarity different from the polarity of the substance for controlling conductivity characteristic contained in the intermediate layer 12 (e.g. n-type), if desired, or a substance of the same polarity may be contained therein, when the practical amount contained in the intermediate layer 12 is larger, in an amount which is far smaller than said amount.

Formation of the photosensitive layer 13 may be practiced, similarly as in the case of the intermediate layer 12, by introducing a compound containing silicon and halogen into the activation space (A), decomposing these under a high temperature or exciting these through the action of discharging energy or light energy to form active species (A) and introducing said active species into the film forming space (A).

Also, alternatively, gaseous silicon containing compound and germanium containing compound, optionally together with hydrogen, a halogen compound, an inert gas, a carbon containing compound, a gas of a compound containing an impurity element as the component, etc., are introduced into the activation space (A), and a deposited film may be formed by permitting light energy to act in an atmosphere where the respective species introduced are co-present.

Figure 2:
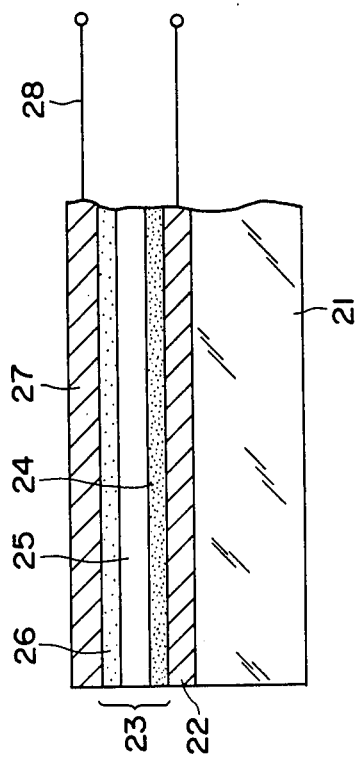
FIG. 2 is a schematic sectional view for illustration of a construction example of the PIN type diode produced by use of the process of the present invention.

FIG. 2 is a schematic illustration showing a typical example of PIN type diode device utilizing a deposited film of an amorphous material containing silicon, germanium and optionally hydrogen and/or halogen (hereinafter written as "A-SiGe(H, X)") doped with an impurity element which is prepared by practicing the process of the present invention.

In the drawing, 21 is a substrate, 22 and 27 are thin film electrodes, 23 is a semiconductor film constituted of an n-type semiconductor layer 24, an i-type semiconductor layer 25 and a p-type semiconductor layer 26.

These semiconductor layers are constituted of A-Si(H, X, Ge), A-SiGe(H, X), A-Ge(H, X), etc., and the process of the present invention may be applicable for preparation of any of these layers. 28 is a conductive wire to be connected to an external electrical circuit device.

As the substrate 21, there may be employed electroconductive, semiconductive or insulating materials. When the substrate 21 is electroconductive, the thin film electrode 22 may be omitted. As the semiconductive substrate, there may be employed, for example, semiconductors such as Si, Ge, GaAs, ZnO, ZnS, etc. Thin film electrodes 22, 27 can be obtained by providing thin films of NiCr, Al, Cr, Mo, Au, Ir, Nb, Ta, V, Ti, Pt, Pd, $In_2O_3$, $SnO_2$, ITO ($In_2O_3+SnO_2$), etc. on a substrate by treatment such as vacuum deposition, electron beam vapor deposition, sputtering, etc. The electrodes 22, 27 have a film thickness preferably of 30 to $5\times10^4$ Å, more preferably 100 to $5\times10^3$ Å.

For making the film constituting the semiconductor layer 23 of A-SiGe(H,X) n-type or p-type, if desired, it can be formed by doping with a n-type impurity or a p-type impurity of the impurity elements or both impurities into the layer to be formed, while controlling its amount.

For formation of n-type, i-type and p-type A-SiGe (H, X) layers, a compound containing silicon and halogen are introduced into the activation space (A), and these are decomposed under the action of an activation energy according to the process of the present invention, whereby active species (A) of, for example, $SiF_2^*$ can be formed and introduced into the film forming space. Also, alternatively, gaseous silicon containing compound and germanium containing compound, optionally together with an inert gas and a gas containing an impurity element as the component, are excited and decomposed by respective activation energies to form respective active species, which are then separately or in an appropriate mixture introduced into the film forming space wherein the substrate 11 is placed. The active species introduced into the film forming space are excited to undergo, promote or amplify chemical reactions by use of light energy and/or heat energy to form a desired deposited film on the substrate 11. The n-type and p-type semiconductor A-SiGe(H, X) layers have a layer thickness preferably of 100 to $10^4$ Å, more preferably 300 to 2000 Å.

On the other hand, the i-type A-SiGe(H, X) layer has preferably a layer thickness of 500 to $10^4$ Å, more preferably 1000 to 10000 Å.

The PIN type diode device shown in FIG. 2 is not necessarily required to prepare all the layers of p, i and n types according to the process of the present invention, but the present invention can be practiced by preparing at least one layer of p, i and n according to the process of the present invention.

According to the process for forming a deposited film of the present invention, electrical, optical, photoconductive and mechanical characteristics desired for the film formed can be improved, and yet a high speed film formation becomes possible. Also, reproducibility in film formation can be improved to enable improvement of the film quality and uniformization of the film quality, and the process is also advantageous in enlargement of area of the film and can accomplish easily improvement of productivity of film as well as mass production of films. Further, since light energy is used as the activation energy during film formation, there can be exhibited such effects that film formation can be effected also on, for example, a substrate which is poor in heat resistance or susceptible to plasma etching action, and that the steps can be shortened by low temperature treatment. Further, since relatively low heat energy is used as the activation energy during film formation, there can be exhibited such effects that film formation can be effected also on, for example, a substrate which is poor in heat resistance or susceptible to plasma etching action, and that the steps can be shortened by low temperature treatment.

The present invention will now be described by way of its Examples.

EXAMPLE 1

Figure 3:
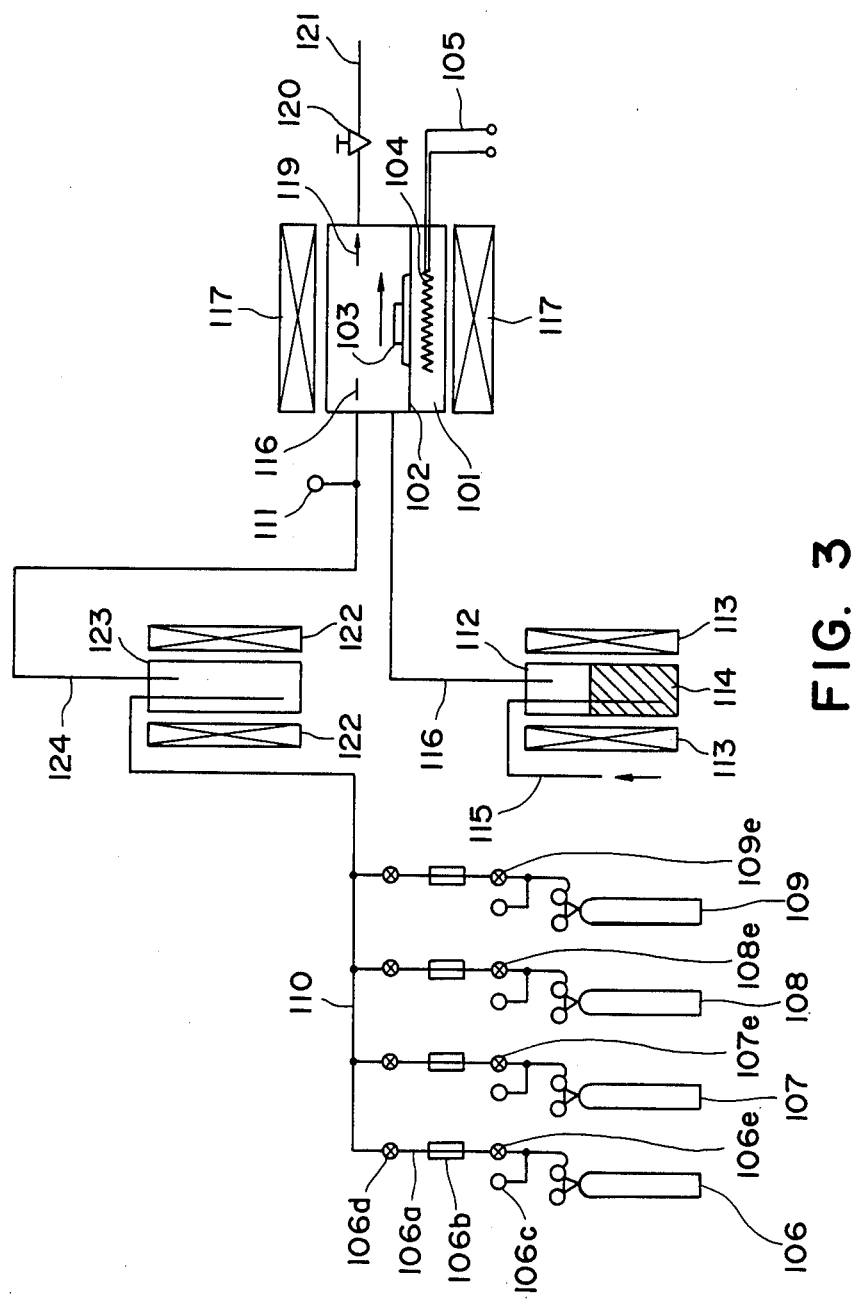
FIG. 3 through FIG. 6 are schematic diagrams for illustration of the constitutions of the devices for practicing the process of the present invention employed in respective examples.

Using the apparatus shown in FIG. 3, i-, p- and n-type A-SiGe (H, X) deposition films were formed in accordance with the following procedures.

In FIG. 3, a desired substrate 103 is placed on a substrate support 102 in a film deposition chamber 101.

A heater 104 is used to preheat the substrate 103 or to anneal the formed film in order to improve its characteristics. Power is supplied to the heater 104 through wiring 105. The heater 104 is not driven during film deposition.

Gas supply systems 106 to 109 are arranged in accordance with types of gases used, such as germanium containing compounds, hydrogen, halogen compounds, inert gases, silicon containing compounds, carbon containing compounds, and other compounds containing impurity element as the component. When selected gases are liquids in normal state, conventional gasifying units can be used.

Branch pipes 106a to 109a, flowmeters 106b to 109b, pressure meters at high pressure sides 106c to 109c, and gas flow regulation valves 106d to 109d and 106e to 109e for controlling the gas flow rates are arranged for the systems 106 to 109.

123 is an activation chamber for producing an active species (B). A microwave plasma generator 122 for generating activation energy for producing an active species (B) is arranged around the activation chamber 123. A gas for producing the active species (B) is supplied from a gas inlet pipe 110 and activated in the activation chamber (B) 123, and the produced active species (B) is introduced into the film forming chamber 101 through an inlet pipe 124. A gas pressure meter 111 is connected to the pipe 124.

The apparatus also has an activation chamber (A) 112 and an electric furnace 113. Solid Si particle 114 is charged in the chamber 112. 115 is an inlet pipe for supplying gasified Si and a halogen containing compound as a source of the active species (A). The active species (A) produced in the activation chamber (A) 112 is supplied to the film forming chamber 101 through an inlet pipe 116.

An optical energy generating unit 117 comprises a mercury lamp, a xenon lamp, a carbon dioxide gas laser, an Ar gas laser, an Excimer laser, or the like.

Light, directed to the entire surface or a desired portion of the substrate 103 using an optical system from the unit 117, is radiated onto the active species flowing in the direction indicated by arrow 119. The irradiated species chemically react to form a A-SiGe (H, X) deposition film on the entire or desired portion of the substrate 103. The interior of the chamber 101 is evacuated through an evacuation valve 120 and an evacuation pipe 121.

In this Example, a substrate 103 of polyethylene terephthalate was placed on the support 102, and the chamber 101 was evacuated by a vacuum equipment to a pressure of about $10^{-6}$ Torr. 150 SCCM of $GeH_4$ gas or a mixture thereof with 40 SCCM of $PH_3$ or $B_2H_6$ gas (both dilutad in 1,000 ppm hydrogen gas) from a bomb 106 for supplying gases was supplied to the activation chamber (B) 123 through the gas inlet pipe 110. The $GeH_4$ and/or $PH_3$ or $B_2H_6$ gas supplied into the activation cahmber (B) 123 were activated by the microwave plasma generator 122 into hydrogenated Ge active species and the like, which were supplied into the film forming chamber 101 through the inlet piep 124.

The solid Si particle 114 was placed in the activation chamber (A) 112 and heated to be red hot (about 1,000° C.) by the electric furnace 113. $SiF_4$ was blown from a bomb (not shown) through the inlet pipe 115 so as to produce an active species $SiF_2^*$, which was supplied to the film forming chamber 101 through the inlet pipe 116.

The pressure in the film forming chamber 101 was kept at 0.4 Torr while light was emitted from a 1-kW Xe lamp, directed perpendicularly to the substrate 103. Non-doped and doped A-SiGe (H, X) films (700 Å thickness) were thus formed. The film forming rate was 25 Å/sec.

The non-doped or doped p-type A-SiGe (H, X) film sample was placed in a deposition chamber. An interdigital Al gap electrode (250μgap length; 5 mm width) was formed at a vacuum pressure of $10^{-5}$ Torr. Thereafter, a dark current was measured at an application voltage of 10V, dark conductivity σd was measured, and the characteristics of each film were evaluated. The obtained results are shown in Table 1A.

EXAMPLES 2 to 4

A-SiGe (H, X) films were formed follwing the same procedures as in Example 1 except that straight chain $Ge_4H_{10}$, branched chain $Ge_4H_{10}$, or $H_6Ge_6F_6$ was in place of $GeH_4$. Dark conductivity of each sample was measured, and the obtained results are shown in Table 1A.

TABLE 1A

| | Example | | | |
|---|---|---|---|---|
| Item | Example 1 | Example 2 | Example 3 | Example 4 |
| Starting gas for producing active species (B) | $GeH_4$ | Straight chain $Ge_4H_{10}$ | Branched chain $Ge_4H_{10}$ | $H_6Ge_6F_6$ |
| σd (non-doped) $(\Omega \cdot cm)^{-1}$ | $9.0 \times 10^{-8}$ | $7.5 \times 10^{-8}$ | $8.0 \times 10^{-8}$ | $6.0 \times 10^{-8}$ |
| σd (doped with B) $(\Omega \cdot cm)^{-1}$ | $7.3 \times 10^{-7}$ | $3.1 \times 10^{-7}$ | $3.3 \times 10^{-7}$ | $6.4 \times 10^{-7}$ |
| σd (doped with P) $(\Omega \cdot cm)^{-1}$ | $4.3 \times 10^{-6}$ | $5.6 \times 10^{-6}$ | $7.1 \times 10^{-6}$ | $3.8 \times 10^{-6}$ |

It is seen from Table 1A that A-SiGe (H, X) films obtained according to the present invention have excellent electrical characteristics and are well doped.

EXAMPLE 5

Figure 4:
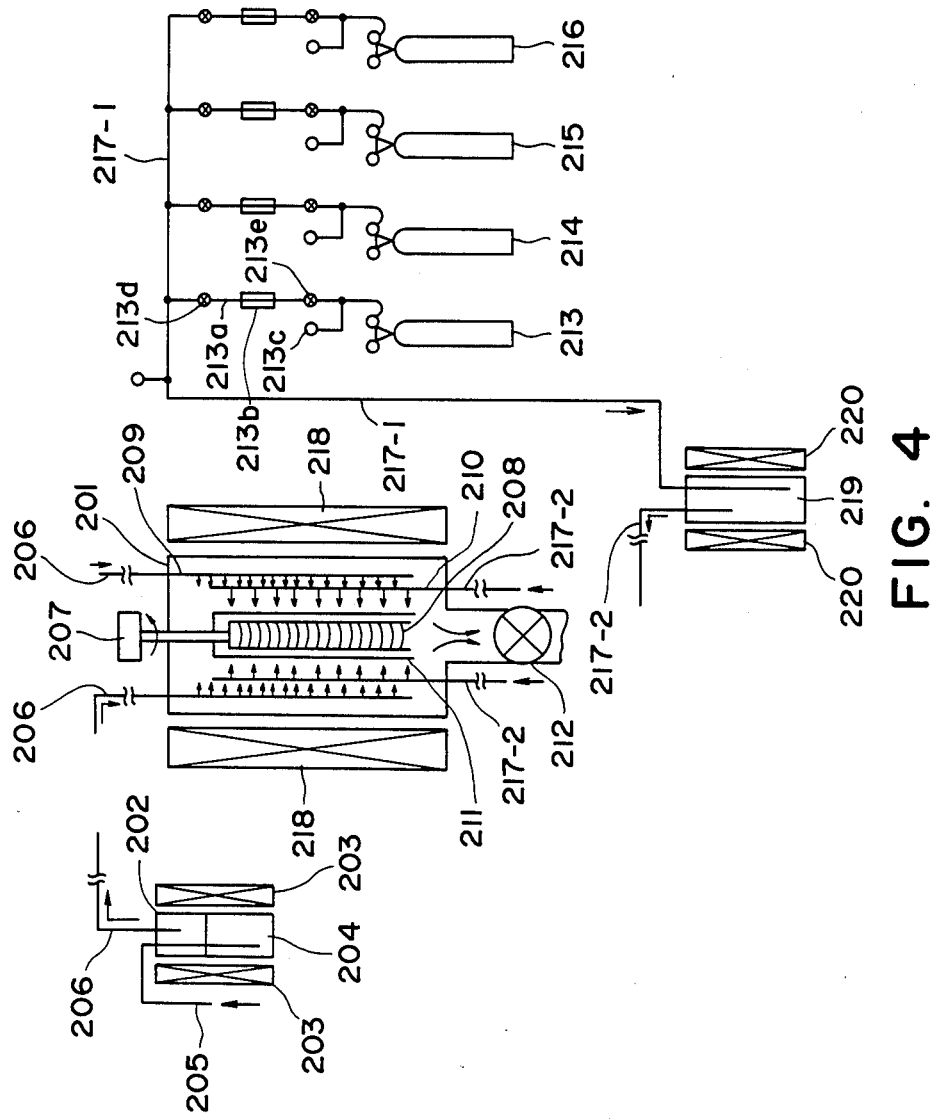

Using the apparatus shown in FIG. 4, a drum-like electrophotographic image forming member having a layer structure shown in FIG. 1 was prepared in accodance with the following procedures.

The apparatus shown in FIG. 4 has a film forming chamber 201, an activation chamber (A) 202, an electric furnace 203, solid Si particle 204, an inlet pipe 205 for a starting material producing the active species (A), an active species (A) inlet pipe 206, a motor 207, a heater 208 used in the same manner as the heater 104 in FIG. 3, blow nozzles 209 and 210, an Al cylindrical substrate 211, and an evacuation valve 212. Gas supply ststems 213 to 216 are similar to the gas supply systems 106 to 109, and are connected to a gas inlet pipe 217-1 through corresponding branch pipes 213a to 216a, flowmeters 213b to 216b, pressure meters 213c to 216c, and gas flow regulation valves 213d to 216d and 213e to 216e.

The Al cylindrical substrate 211 was suspended in the film forming chamber 201. The heater 208 was arranged in the substrate 211 and was rotated by the motor 207. An optical energy generator 218 emits light toward a desired surface portion of the cylindrical substrate 211 of aluminum.

The solid Si particle 204 was placed in the activation chamber (A) 202 and heated to a red hot state (about 1,100° C.) by the electric furnace 203. SiF$_4$ was blown through the inlet pipe 206. SiF$_2$* as an active species (A) was produced and was then supplied to the film forming chamber 201 through the inlet pipe 206.

Si$_2$H$_6$, GeH$_4$, and H$_2$ gases were supplied to an activation chamber (B) 219 from the inlet pipe 217-1.

The supplied Si$_2$H$_6$, GeH$_4$ and H$_2$ gases were activated (e.g. converted into plasmas) in the activation chamber (B) 219 by a microwave plasma generator 220 into a hydrogenated Si active species, a hydrogenated Ge active species, and active hydrogen, which were supplied to the film forming chamber 201 through an inlet pipe 217-2. If required, an impurity gas such as PH$_3$ or B$_2$H$_6$ was also supplied to the chamber (B) 219 and activated. While the internal pressure of the film forming chamber 201 was kept at 1.0 Torr, light from a 1-kW Xe lamp 218 was perpendicularly emitted on the outer circumferential surface of the Al cylindrical substrate 211.

The Al cylindrical substrate 211 was rotated, and the gas was then exhausted by suitably adjusting the opening of the evacuation valve 212 to form a photosensitive layer 13.

Prior to formation of the photosensitive layer 13, an intermediate layer 12 having a thickness of 2,000 Å was formed by supplying a gas mixture of Si$_2$H$_6$, GeH$_4$, H$_2$, and B$_2$H$_6$ (the volume content of B$_2$H$_6$ was 0.2%) through the inlet pipe 217-1 to the chamber 219 and subsequently to the chamber 201.

COMPARATIVE EXAMPLE 1

An electrophotographic drum member having a layer structure as shown in FIG. 1 was formed by the conventional plasma CVD method using SiF$_4$, Si$_2$H$_6$, GeH$_4$, H$_2$, and B$_2$H$_6$ gases, a film forming chamber as the film forming chamber 201 described above, and a high frequence generator of 13.56 MHz.

The manufacturing conditions and performances of the electrophotographic drum members obtained in Example 5 and Comparative Example 1 are shown in Table 2A.

TABLE 2A

| Item | Example 5 | Comparative Example 1 |
|---|---|---|
| Starting gas for producing active species (A) | SiF$_4$ | |
| Activation temperature | 1100° C. | |
| Main active species | SiF$_2$* | |
| Starting gas for producing active species (B) | Si$_2$H$_6$/GeH$_4$/H$_2$ | |
| Gas amount from activation chamber (A) | 200 SCCM | |
| Gas amount from activation chamber (B) | 100 SCCM | |
| Gas amount from starting gas bomb | | SiF$_4$ 200 SCCM<br>Si$_2$H$_6$ 100 SCCM<br>GeH$_4$ 50 SCCM<br>H$_2$ 100 SCCM |
| Internal pressure of film forming chamber | 1.0 Torr | 1.0 Torr |
| Film forming rate | 20 Å/sec | 5 Å/sec |
| RF discharge power | | 130 W |
| Thickness of layer 13 | 22μ | 22μ |
| Average number of image defects of 10 electrophotographic drums | 3 | 22 |
| Circumferential potential variation | ±13 V | ±33 V |
| Axial potential variation | ±18 V | ±40 V |
| Note | Example of method of the present invention | Conventional plasma CVD Base temperature: 250° C. |

EXAMPLE 6

A PIN diode like that shown in FIG. 2 was manufactured, using GeH$_4$ as a germanium containing compound, with the apparatus shown in FIG. 3.

A polyethylene terephthalate film 21 having a 1,000 Å thick ITO film 22 was placed on the support 102. After the film forming chamber 101 was evacuated to a pressure of 10$^{-6}$ Torr, an active species SiF$_2$* prepared in the same manner as in Example 1 was introduced in the film forming chamber 101. Si$_3$H$_6$, GeH$_4$, and PH$_3$ (diluted with 1,000 ppm hydrogen gas) gases were introduced into the activation chamber (B) 123 and were activated.

The activated gases were introduced into the film forming chamber 101 through the gas inlet pipe 116 and an n-type A-SiGe (H, X) film 24 (700 Å thickness) doped with P was formed by irradiation with a 1 kW Xe lamp while the pressure in the film forming chamber 101 was kept at 0.4 Torr.

An i-type A-SiGe (H,X) film 25 (5,000 Å thickness) was formed following the same procedures as in the case of the n-type A-SiGe (H,X) film, except that B$_2$H$_6$ gas (diluted with 300 ppm hydrogen gas) was introduced in place of the PH$_3$ gas.

A p-type A-SiGe (H, X) film 26 (700 Å thickness) doped with B was formed under the same conditions as in the case of the n-type A-SiGe (H, X) film, except that B$_2$H$_6$ gas (diluted with 1,000 ppm hydrogen gas) was introduced in place of the PH$_3$ gas. An Al electrode 27 having a thickness of 1,000 Å was formed on the p-type film by vacuum deposition, thereby completing a PIN diode.

The I-V characteristics of the obtained diode element (area: 1 cm$^2$) were measured, and the rectification and photovoltaic characteristics were evaluated. The obtained results are shown in Table 3A.

When the light emission characteristics of the diode were tested by emitting light from the substrate side at a light emission intensity AMI of about 100 mW/cm$^2$, a short-circuit current of 100 mA/cm², a conversion efficiency of 7.0% or more, and an open circuit voltage of 0.89V were obtained.

EXAMPLES 7 to 9

PIN diodes the same as in Example 6 were manufactured following the same procedures therein, except that straight chain $Ge_4H_{10}$, branched chain $Ge_4H_{10}$ or $H_6Ge_6F_6$ were used in place of $GeH_4$ as a germanium containing compound. The rectification and photovoltaic characteristics of the obtained samples were evaluated, and the obtained results are shown in Table 3A.

TABLE 3A

| | Example | | | |
|---|---|---|---|---|
| Item | Example 6 | Example 7 | Example 8 | Example 9 |
| Starting gas for producing active species (B) | $GeH_4$ | Straight chain $Ge_4H_{10}$ | Branched chain $Ge_4H_{10}$ | $H_6Ge_6F_6$ |
| Rectification ratio of diode(*1) | $7.4 \times 10^2$ | $7.3 \times 10^2$ | $7.2 \times 10^2$ | $7.8 \times 10^2$ |
| n value of diode(*2) | 1.3 | 1.4 | 1.42 | 1.36 |

(*1) Ratio of forward to reverse current at voltage of 1V
(*2) n value (Quality Factor) in current equation $$J = Js\left\{ \exp\left(\frac{eV}{nRT}\right) - 1 \right\} \text{ at p-n junction}$$

It is seen from Table 3A, that the present invention provides an A-SiGe (H,X) PIN diode having excellent optical and electrical characteristics when compared with conventional diodes.

EXAMPLE 10

Figure 5:
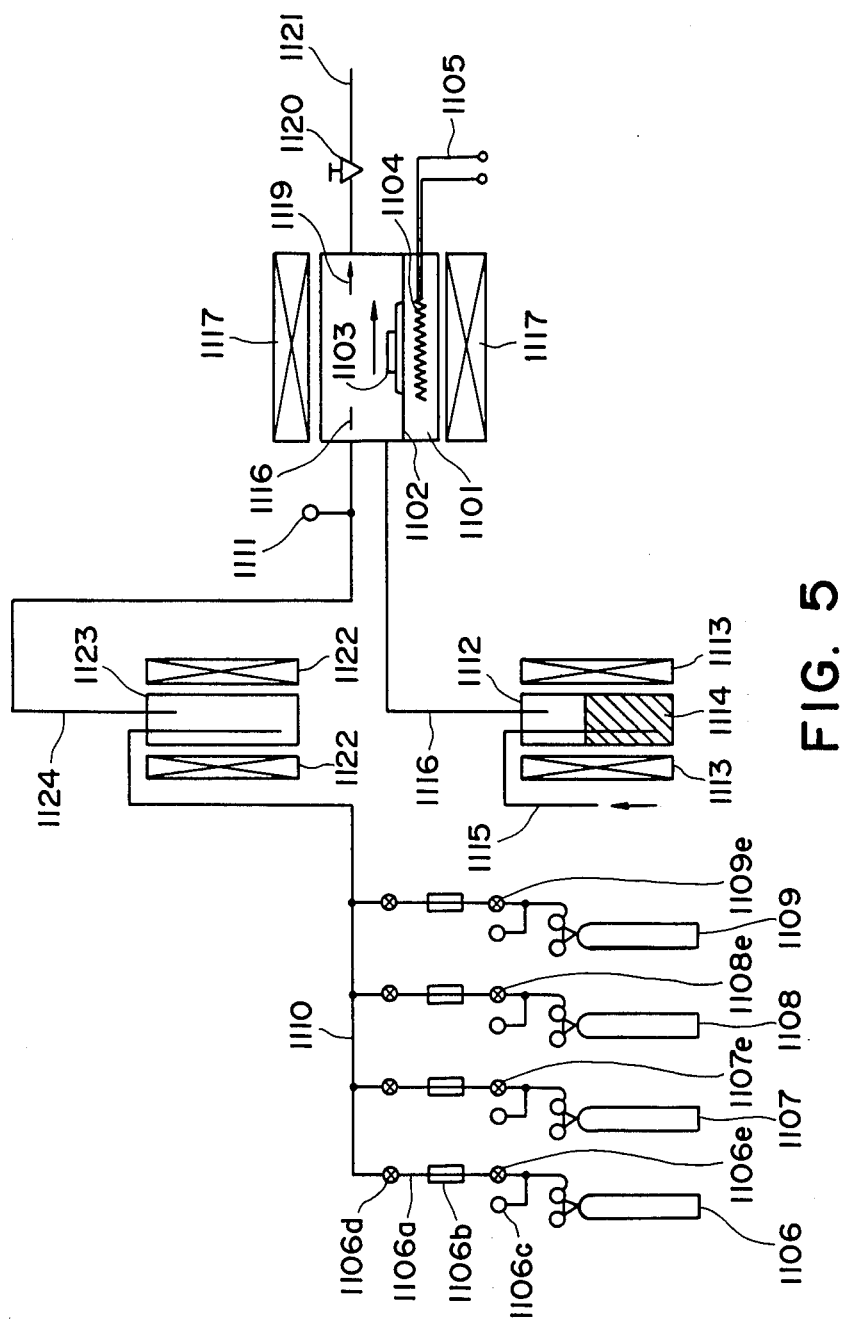

I-, p-, and n-type A-SiGe (H, X) films were deposited by using an apparatus shown in FIG. 5 in accordance with the following procedures.

In FIG. 5, a desired substrate 1103 is placed on a substrate support 1102 inside a film forming chamber 1101.

A substrate heater 1104 is used to heat the substrate 1103 before film formation and to anneal the formed film in order to improve its characteristics. Power is supplied to the heater 1104 through wiring 1105. The substrate temperature is not particularly limited. However, according to the present invention, the substrate temperature is preferably 50° to 450° C., and more preferably 100° to 350° C.

Gas supply systems 1106 to 1109 are arranged in accordance with types of gases used, such as germanium containing compounds, hydrogen, halogen compounds, inert gases, silicon containing compounds, carbon containing compounds, and other compounds containing an impurity element as the component. When selected gases are liquids in normal state, conventional gasifying units can be used.

Branch pipes 1106a to 1109a, flowmeters 1106b to 109b, pressure meters at high pressure sides 1106c to 109c, and gas flow regulation valves 1106d to 1109d and 1106e to 1109e for controlling the gas flow rates are arranged for the system 1106 to 1109. An activation chamber (B) 1123 is for producing an active species (B). A microwave plasma generator 1122 for generating activation energy for producing the active species (B) is arranged around the activation chamber 1123. A starting gas for producing the active species (B) is supplied from a gas inlet pipe 1110 and activated in the activation chamber (B), and the produced active species (B) is supplied into the film forming chamber 1101 through an inlet pipe 124.

A gas pressure meter 1111 is connected to the pipe 124. The apparatus also has an activation chamber (A) 112 and an electric furnace 1113. Solid Si particle 114 is placed in the chamber 1112. An inlet pipe 1115 supplies gasified an Si and halogen containing compound as a source of the active species (A). The active species (A) produced in the activation chamber (A) 1112 is supplied to the film forming chamber 1101 through an inlet pipe 1116.

A thermal energy generator 1117 can comprise a conventional electric furnace, a high-frequency heater, or other type of heater.

Heat from the thermal energy generator 1117 acts on active species (A) and (B) flowing in the direction indicated by arrow 1119. The species chemically react with each other to form an A-SiGe (H,X) deposited film on the entire surface or a desired surface portion of the substrate 1103. An evacuation pipe 1121 with an evacuation valve 1120 is connected to the film forming chamber 1101.

In this Example, a polyethylene terephthalate substrate 1103 was placed on the support 1102. The interior of the film forming chamber 1101 was evacuated to a pressure of about $10^{-6}$ Torr by using a vacuum equipment (not shown). Keeping the substrate 1103 at the temperature shown in Table 1B, 150 SCCM of $GeH_4$ or a mixture thereof with 40 SCCM of $PH_3$ or $B_2H_6$ (both diluted with 1,000 ppm hydrogen gas) was supplied from a gas bomb 1106 to the activation chamber (B) 1123 through the gas inlet pipe 1110. The $GeH_4$ gas and/or $PH_3$ or $B_2H_6$ supplied to the activation chamber (B) 1123 were activated by the microwave plasma generator 1122 to provide $GeH_n$ active species (n=1−3), activated hydrogen and the like, which were supplied to the film forming chamber 1101 through the inlet pipe 1124.

The solid Si particle 1114 placed in the activation chamber (A) 1112 and was heated by the electric furnace 1113 to a red hot state (about 1,100° C.). $SiF_4$ was blown from a source (not shown) through the inlet pipe 1115 to provide $SiF_2^*$ as an active species (A). The $SiF_2^*$ was supplied to the film forming chamber 1101 through the

TABLE 1B

| | Example | | | |
|---|---|---|---|---|
| Item | Example 10 | Example 11 | Example 12 | Example 13 |
| Starting gas for producing active species (B) | $GeH_4$ | Straight chain $Ge_4H_{10}$ | Branched chain $Ge_4H_{10}$ | $H_6Ge_6F_6$ |
| Substrate temperature (°C.) | 210 | 210 | 220 | 220 |
| σd (Non-doped) $(\Omega \cdot cm)^{-1}$ | $9.0 \times 10^{-7}$ | $4.8 \times 10^{-7}$ | $3.3 \times 10^{-7}$ | $5.9 \times 10^{-8}$ |
| σd (Doped with B) $(\Omega \cdot cm)^{-1}$ | $1.4 \times 10^{-6}$ | $8.4 \times 10^{-6}$ | $1.9 \times 10^{-6}$ | $3.3 \times 10^{-6}$ |
| σp (Doped with P) $(\Omega \cdot cm)^{-1}$ | $3.8 \times 10^{-6}$ | $1.2 \times 10^{-5}$ | $3.3 \times 10^{-5}$ | $4.5 \times 10^{-5}$ | inlet pipe 1116.

While the pressure of the film forming chamber 1101 was kept at 0.4 Torr and the internal temperature of the chamber 1101 was kept at 210° C. by the thermal energy generator 1117, non-doped or an A-SiGe (H, X) films (700 Å thickness) doped with the impurity were formed. The film formation rate was 29 Å/sec.

The obtained A-SiGe (H, X) film samples were placed in a deposition chamber, and interdigital Al electrodes (250μ gap length, 5 mm width) were formed at a vacuum pressure of $10^{-5}$ Torr. Dark current was measured at an application voltage of 10V to obtain dark conductivity d, and the film characteristics of the samples were evaluated. The obtained results are shown in Table 1B.

EXAMPLES 11 to 13

A-SiGe (H, X) films were formed following the same procedures as in Example 10 except that straight chain $Ge_4H_{10}$, branched chain $Ge_4H_{10}$, and $H_6Ge_6F_6$ were used in place of $GeH_4$. The dark conductivity of each sample film obtained was measured, and the obtained results are shown in Table 1B.

It is seen from Table 1B that, according to the present invention, A-SiGe (H, X) films having excellent electrical characteristics can be obtained at relatively low substrate temperatures, and doping can be satisfactorily performed.

EXAMPLE 14

Figure 6:
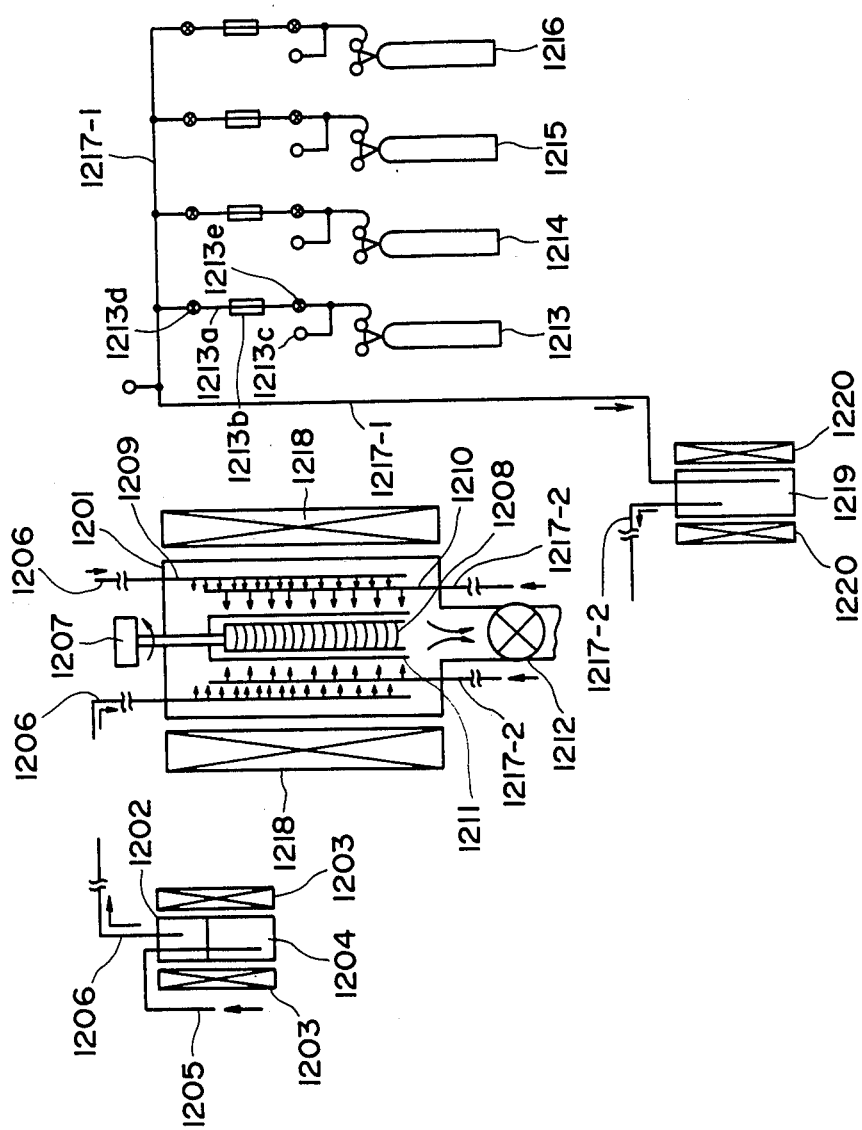

An electrophotograhic drum member having a layer structure as shown in FIG. 1 was manufactured using the apparatus as shown in FIG. 6.

The apparatus shown in FIG. 6 has a film forming chamber 1201, an activation chamber (A) 1202, an electric furnace 1203, solid Si particle 1204, an inlet pipe 1205 for a starting material producing the active species (A), an active species (A) inlet pipe 1206, a motor 1207, a heater 1208 used in the same manner as the heater 1104 in FIG. 5, blow nozzles 1209 and 1210, an Al cylindrical substrate 1211, and an evacuation valve 1212. Gas supply systems 1213 to 1216 are similar to the gas supply systems 1106 to 1109 in FIG. 5, and are connected to a gas inlet pipe 1217-1 through corresponding branch pipes 1213a to 1216a, flowmeters 1213b to 1216b, pressure meters 1213c to 1216c, and gas flow regulation valves 1213d to 1216d and 1213e to 1216e.

The Al cylindrical substrate 1211 is suspended in the film forming chamber 1201. The heater 1208 is arranged in the substrate 1211 and is rotated by the motor 1207. A thermal energy generator 1218 can comprise a conventional electric furnace, an RF generator, or various other heaters.

The solid Si particle 1204 was placed in the activation chamber (A) 1202 and heated to a red hot state (about 1,100° C.) by the electric furnace 1203. $SiF_4$ was blown through the inlet pipe 1206 from a bomb (not shown). $SiF_2^*$ as an active species (A) was produced and was then supplied to the film forming chamber 1201 through the inlet pipe 1206.

$Si_2H_6$, $GeH_4$, and $H_2$ gases were supplied to an activation chamber (B) 1219 from the inlet pipe 1217-1, and were activated (converted into plasmas) by a microwave plasma generator 1220 into $Si_nH_m$ (n=1, 2; m=1 to 5), $GeH_l$ (l=1 to 3) and active hydrogen, which were supplied to the film forming chamber 1201 through an inlet pipe 1217-2. If required, an impurity gas such as $PH_3$ or $B_2H_6$ is also supplied to the activation chamber (B) 1219 and activated. While the internal pressure of the chamber 1201 was kept at 1.0 Torr, the internal temperature of the film forming chamber 1201 was kept at 200° C. by the thermal energy generator.

The Al cylindrical substrate 1211 was rotated, and heated and held at 220° C. by the heater 1208. The gas was then exhausted by suitably adjusting the opening of the evacuation valve 1212 to form a photosensitive layer 13.

Prior to formation of the photosensitive layer, an intermediate layer 12 having a thickness of 2,000 Å was formed by supplying a gas mixture of $Si_2H_6$, $GeH_4$, $H_2$, and $B_2H_6$ (the volume content of $B_2H_6$ was 0.2%) through the inlet pipe 1217-1.

COMPARATIVE EXAMPLE 2

An electrophotographic drum member having a layer structure as shown in FIG. 1 was manufactured by the conventional plasma CVD method using a film forming chamber as the film forming chamber 1201 and a high frequency generator of 13.56 MHz.

The manufacturing conditions and performances of the electrophotographic drum member obtained in Example 14 and Comparative Example 2 are shown in Table 2B.

TABLE 2B

| Item | Example 14 | Comparative Example 2 |
|---|---|---|
| Starting gas for producing active species (A) | $SiF_4$ | |
| Activation temperature | 1100° C. | |
| Main active species | $SiF_2^*$ | |
| Starting gas for producing active species (B) | $Si_2H_6/GeH_4/H_2$ | |
| Gas amount from activation chamber (A) | 200 SCCM | |
| Gas amount from activation chamber (B) | 100 SCCM | |
| Gas amount from starting gas bomb | | $SiF_4$ 200 SCCM<br>$Si_2H_6$ 100 SCCM<br>$GeH_4$ 50 SCCM<br>$H_2$ 100 SCCM |
| Internal pressure of film forming chamber | 1.0 Torr | 1.0 Torr |
| Substrate temperature | 220° C. | |
| Temperature in film forming chamber | 200° C. | |
| Film forming rate | 27 Å/sec | 5 Å/sec |
| RF discharge power | | 1.8 W/cm² |
| Thickness of layer 13 | 24μ | 24μ |
| Average number of image defects of 10 electrophotographic drums | 3 | 18 |
| Circumferential potential variation | ±10 V | ±35 V |
| Axial potential variation | ±12 V | ±40 V |
| Note | Example of method of the present invention | Conventional plasma CVD Substrate temperature: 250° C. |

EXAMPLE 15

A PIN diode like that shown in FIG. 2 was manufactured, using GeH₄ as a germanium containing compound, with the apparatus shown in FIG. 5.

A polyethylene terephthalate having a 1,000 Å thick ITO film 22 deposited thereon was placed on the support 1102, and the film forming chamber interior was evacuated to a pressure of $10^{-6}$ Torr. The active species SiF₂* produced in the same manner as in Example 10 was introduced into the film forming chamber 1101. Si₃H₆, GeH₄, and PH₃ (diluted with 1,000 ppm hydrogen gas) gases were introduced into the activation chamber (B) 1123 and were activated. The activated gases were introduced into the film forming chamber 1101 through the gas inlet pipe 1116. While the pressure in the film forming chamber 1101 was kept at 0.4 Torr and the substrate temperature was kept at 220° C., an n-type A-SiGe (H, X) film 24 (700 Å thickness) doped with P was formed.

An i-type A-SiGe (H, X) film 25 (5,000 Å thickness) was formed by the same method as in the case of the n-type A-SiGe (H, X) film, except that B gas (diluted with 300 ppm hydrogen gas) was used in place of the PH₃ gas.

A p-type A-SiGe (H, X) film 26 (700 Å thickness) doped with B was formed under the same conditions as in the case of the n-type A-SiGe (H, X) film, except that B₂H₆ (diluted with 1,000 ppm hydrogen gas) was used with H₂ gas. An Al electrode 27 having a thickness of 1,000 Å was formed on the p-type A-SiGe (H, X) film by vacuum deposition to obtain a PIN diode.

The I-V characteristics of the obtained diode element (1 cm² area) were measured, and the rectification and photovoltaic characteristics were evaluated. The obtained results are shown in Table 3B.

When the light emission characteristics of the diode were examined by irradiating light from the substrate side at a light emission intensity AMI of about 100 mW/cm², a short-circuit current of 9.8 mA/cm², a conversion efficiency of 7.1% or more and an open circuit voltage of 0.87V were obtained.

EXAMPLES 16 to 18

PIN diodes as in Example 15 were manufactured following the same procedures therein, except that straight chain Ge₄H₁₀, branched chain Ge₄H₁₀, and H₆Ge₆F₆ were used in place of GeH₄ as a germanium containing Ge compound. The rectification and photovoltaic characteristics of the diodes were evaluated, and the obtained results are shown in Table 3B.

It is seen from Table 3B that the present invention provides A-SiGe (H, X) PIN diodes containing germanium, which are excellent optical and electrical characteristics when compared with conventional diodes.

TABLE 3B

| | Example | | | |
|---|---|---|---|---|
| Item | Example 15 | Example 16 | Example 17 | Example 18 |
| Starting gas for producing active | GeH₄ | Straight chain Ge₄H₁₀ | Branched Ge₄H₁₀ | H₆Ge₆F₆ |

TABLE 3B-continued

| | Example | | | |
|---|---|---|---|---|
| Item | Example 15 | Example 16 | Example 17 | Example 18 |
| species (B) | | | | |
| Substrate temperature (°C.) | 220 | 220 | 220 | 220 |
| Rectification ratio of diode(*1) | $6.2 \times 10^2$ | $7.8 \times 10^2$ | $1.5 \times 10^2$ | $3.4 \times 10^2$ |
| n value of diode(*2) | 1.25 | 1.23 | 1.3 | 1.26 |

(*1) Ratio of forward to reverse current at voltage of 1V
(*2) n value (Quality Factor) in current equation $$J = J_s \left\{ \exp\left(\frac{eV}{nRT}\right) - 1 \right\} \text{ at p-n junction}$$

What we claim is:

1. A process for forming a deposited film comprising separately introducing an active species (A) and and active species (B) into a film forming space for formation of a deposited film on a substrate, said active species (A) being formed by decomposing a compound containing silicon and a halogen; and said active species (B) being formed by decomposing a germanium containing compound for film formation which is chemically mutually reactive with said active species (A); and irradiating both said active species (A) and active species (B) with light energy and allowing both active species (A) and active species (B) to react chemically with each other thereby to form a deposited film of the substrate.

2. A process according to claim 1, wherein said compound containing silicon and a halogen is selected from the group consisting of:

(a) chain silicon halides represented by $$Si_u Y_{2u+2}$$ 

wherein u is an integer of 1 or more, and Y is selected from the group consisting of F, Cl, Br, I and mixtures thereof;

(b) cyclic silicon halides represented by $$Si_v Y_{2v}$$ 

wherein v is an integer of 3 or more, and Y is as defined above;

(c) chain compounds represented by $$Si_u H_x Y_y$$ 

wherein u is an integer of 1 or more, Y is as defined above, and $x+y=2u+2$; and (d) cyclic compounds represented by $$Si_u H_x Y_y$$ 

wherein Y is as defined above, u is an integer of 3 or more, and $x+y=2u$.

3. A process according to claim 1, wherein said germanium compound is selected from the group consisting of:
(a) chain hydrogenated germanium compounds represented by $$Ge_aH_b$$

wherein a is an integer of 1 or more and $b=2a+2$;
(b) cyclic hydrogenated germanium compounds represented by $$Ge_aH_b$$

wherein a is an integer of 3 or more and $b=2a$;
(c) polymers of said chain and of said cyclic hydrogenated germanium compounds;
(d) partially and wholly halogen substituted compounds of said chain and of said cyclic hydrogenated germanium compounds; and
(e) compounds of said chain and of said cyclic hydrogenated germanium compounds in which a part or all of the hydrogen atoms are substituted by organic groups, halogen atoms or mixtures thereof.

4. A process according to claim 1, wherein active species (A) and active species (B) are introduced into the film forming space in a ratio ranging from 10:1 to 1:10.

5. A process according to claim 1, further comprising introducing into the film forming space at least one starting compound selected from the group consisting of hydrogen gas, halogen compounds, inert gases, silicon containing compounds, and carbon containing compounds.

6. A process for forming a deposited film comprising separately introducing an active species (A) and and active species (B) into a film forming space for formation of a deposited film on a substrate, said active species (A) being formed by decomposing a compound containing silicon and a halogen; and said active species (B) being formed by decomposing a germanium containing compound for film formation which is chemically mutually reactive with said active species (A); and
applying heat energy to both said active species (A) and active species (B) and allowing both active species (A) and active species (B) to chemically react with each other thereby to form a deposited film on the substrate.

7. A process according to claim 6, wherein said compound containing silicon and a halogen is selected from the group consisting of:
(a) chain silicon halides represented by $$Si_uY_{2u+2}$$

where in u is an integer of 1 or more, and Y is selected from the group consisting of F, Cl, Br, I and mixtures thereof;
(b) cyclic silicon halides represented by $$Si_vY_{2v}$$

wherein v is an integer of 3 or more, and Y is as defined above;
(c) chain compounds represented by $$Si_uH_xY_y$$

wherein u is an integer of 1 or more, Y is as defined above, and $x+y=2u+2$; and
(d) cyclic compounds represented by $$Si_uH_xY_y$$

wherein Y is as defined above, u is an integer of 3 or more, and $x+y=2u$.

8. A process according to claim 6, wherein said germanium compound is selected from the group consisting of:
(a) chain hydrogenated germanium compounds represented by $$Ge_aH_b$$

wherein a is an integer of 1 or more and $b=2a+2$;
(b) cyclic hydrogenated germanium compounds represented by $$Ge_aH_b$$

wherein a is an integer of 3 or more and $b=2a$;
(c) polymers of said chain and of said cyclic hydrogenated germanium compounds;
(d) partially and wholly halogen substituted compounds of said chain and of said cyclic hydrogenated germanium compounds; and
(e) compounds of said chain and of said cyclic hydrogenated germanium compounds in which a part or all of the hydrogen atoms are substituted by organic groups, halogen atoms or mixtures thereof.

9. A process according to claim 6, wherein active species (A) and active species (B) are introduced into the film forming space in a ratio ranging from 10:1 to 1:10.

10. A process according to claim 6, further comprising introducing into the film forming space at least one starting compound selected from the group consisting of hydrogen gas, halogen compounds, inert gases, silicon containing compounds, and carbon containing compounds.

11. A process according to claim 1 or 6, further comprising introducing into the film forming space an active species (PN) for introducing an impurity element into the deposited film; said active species (PN) being formed by activating a compound containing said impurity element.

12. A process according to claim 11, wherein said compound containing said impurity element is selected from the group consisting of $PH_3$, $P_2H_4$, $PF_3$, $PF_5$, $PCl_3$, $AsH_3$, $AsF_3$, $AsF_5$, $AsCl_3$, $SbH_3$, $SbF_5$, $SbF_3$, $BF_3$, $BCl_3$, $BBr_3$, $B_2H_6$, $B_4H_{10}$, $B_5H_9$, $B_5H_{11}$, $B_6H_{10}$, $B_6H_{12}$, and $AlCl_3$.

13. A process according to claim 1 or 6, wherein said germanium containing compound is selected from the group consisting of $GeH_4$, $Ge_2H_6$, $Ge_3H_8$, n-$Ge_4H_{10}$, tert-$Ge_4H_{10}$, $Ge_3H_6$, $Ge_5H_{10}$, $GeH_3F$, $GeH_3Cl$, $GeH_2F_2$, $H_6Ge_6F_6$, $Ge(CH_3)_4$, $Ge(C_2H_5)_4$, $Ge(C_6H_5)_4$, $CH_3GeH_3$, $(CH_3)_2GeH_2$, $(CH_3)_3GeH$, $(C_2H_5)_2GeH_2$, $Ge(CH_3)_2F$, $GeF_2$, $GeF_4$, $GeS$, and mixtures thereof.

14. A process according to claim 1 or 6, wherein said compound containing silicon and a halogen is selected from the group consisting of $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$, and mixtures thereof.

15. A process according to claim 5 or 10 wherein said starting compound is a straight-chain silane compound.

16. A process according to claim 15, wherein said straight-chain silane compound is selected from the group consisting of $SiH_4$, $Si_2H_6$, $Si_3H_8$, $Si_4H_{10}$, $Si_5H_{12}$, $Si_6H_{14}$, and mixtures thereof.

17. A process according to claim 5 or 10, wherein said starting compound is a branch-chain silane compound.

18. A process according to claim 17, wherein said branch-chain silane compound is selected from the group consisting of $SiH_3SiH(SiH_3)SiH_3$, $SiH_3SiH(SiH_3)Si_3H_7$, $Si_2H_5SiH(SiH_3)Si_2H_5$, and mixtures thereof.

19. A process according to claim 5 or 10 wherein said starting compound is a cyclic silane compound.

20. A process according to claim 19, wherein said cyclic silane compound is selected from the group consisting of $Si_3H_6$, $Si_4H_8$, $Si_5H_{10}$, $Si_6H_{12}$, and mixtures thereof.

21. A process according to claim 5 or 10, wherein said starting compound is a carbon containing compound selected from the group consisting of methane, ethane, propane, n-butane, pentane, ethylene, propylene, butene-1, butene-2, isobutylene, pentene, acetylene, methylacetylene and butyne.

* * * * *